(12) United States Patent
Smith

(10) Patent No.: US 11,430,887 B2
(45) Date of Patent: Aug. 30, 2022

(54) HIGH VOLTAGE ISOLATION DEVICES FOR SEMICONDUCTOR DEVICES

(71) Applicant: Micron Technology, Inc., Boise, ID (US)

(72) Inventor: Michael A. Smith, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/095,475

(22) Filed: Nov. 11, 2020

(65) Prior Publication Data

US 2022/0149199 A1 May 12, 2022

(51) Int. Cl.
*H01L 29/78* (2006.01)
*H01L 29/10* (2006.01)

(52) U.S. Cl.
CPC ...... *H01L 29/7831* (2013.01); *H01L 29/1033* (2013.01)

(58) Field of Classification Search
CPC ............ H01L 27/0266; H01L 29/1033; H01L 29/7831; H01L 27/11578; H01L 27/0207
See application file for complete search history.

(56) References Cited

U.S. PATENT DOCUMENTS 8,766,365 B2 7/2014 Smith
2012/0068241 A1* 3/2012 Sakuma ............ H01L 27/11551
257/314

* cited by examiner

*Primary Examiner* — Changhyun Yi
(74) *Attorney, Agent, or Firm* — Perkins Coie LLP

(57) ABSTRACT

High voltage isolation devices for semiconductor devices and associated systems, are disclosed herein. The isolation device may support operations of a 3-dimensional NAND memory array of the semiconductor device. In some embodiments, during high voltage operations (e.g., erase operations), the isolation device may provide a high voltage to the memory array while isolating other circuitry supporting low voltage operations of the memory array from the high voltage. The isolation device may include a set of narrow active areas separating the low voltage circuitry from the high voltage and a gate over the narrow active areas. In a further embodiment, the isolation device includes interdigitated narrow active areas and a common gate over the interdigitated narrow active areas to reduce an area occupied by the isolation devices.

20 Claims, 6 Drawing Sheets

HIGH VOLTAGE ISOLATION DEVICES FOR SEMICONDUCTOR DEVICES

TECHNICAL FIELD

The present technology generally relates to semiconductor devices, and more particularly relates to high voltage isolation devices for semiconductor devices.

BACKGROUND

Semiconductor devices are widely used to store information related to various electronic devices such as computers, wireless communication devices, cameras, digital displays, and the like. Information is stored by programming different states of a memory cell. Various types of semiconductor memory devices exist, such as non-volatile memory devices (e.g., NOR flash memory devices, 3-dimensional NAND flash memory devices, etc.) and volatile memory devices (e.g., dynamic RAM (DRAM), synchronous dynamic RAM (SDRAM), etc.).

Improving memory devices, generally, may include increasing memory cell density, increasing read/write speeds or otherwise reducing operational latency, increasing reliability, increasing data retention, reducing power consumption, reducing areas occupied by integrated circuitry, or reducing manufacturing costs, among other metrics. One way of reducing manufacturing costs is to improve manufacturing processes to increase the margin of successfully manufactured devices. Manufacturers can improve the manufacturing margin by implementing processes that, for example, increase the consistency or tolerance of manufacturing steps (e.g., removal or deposition of materials), improve the scale of manufacturing, reduce variability among memory cells, etc.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Figure 1A:
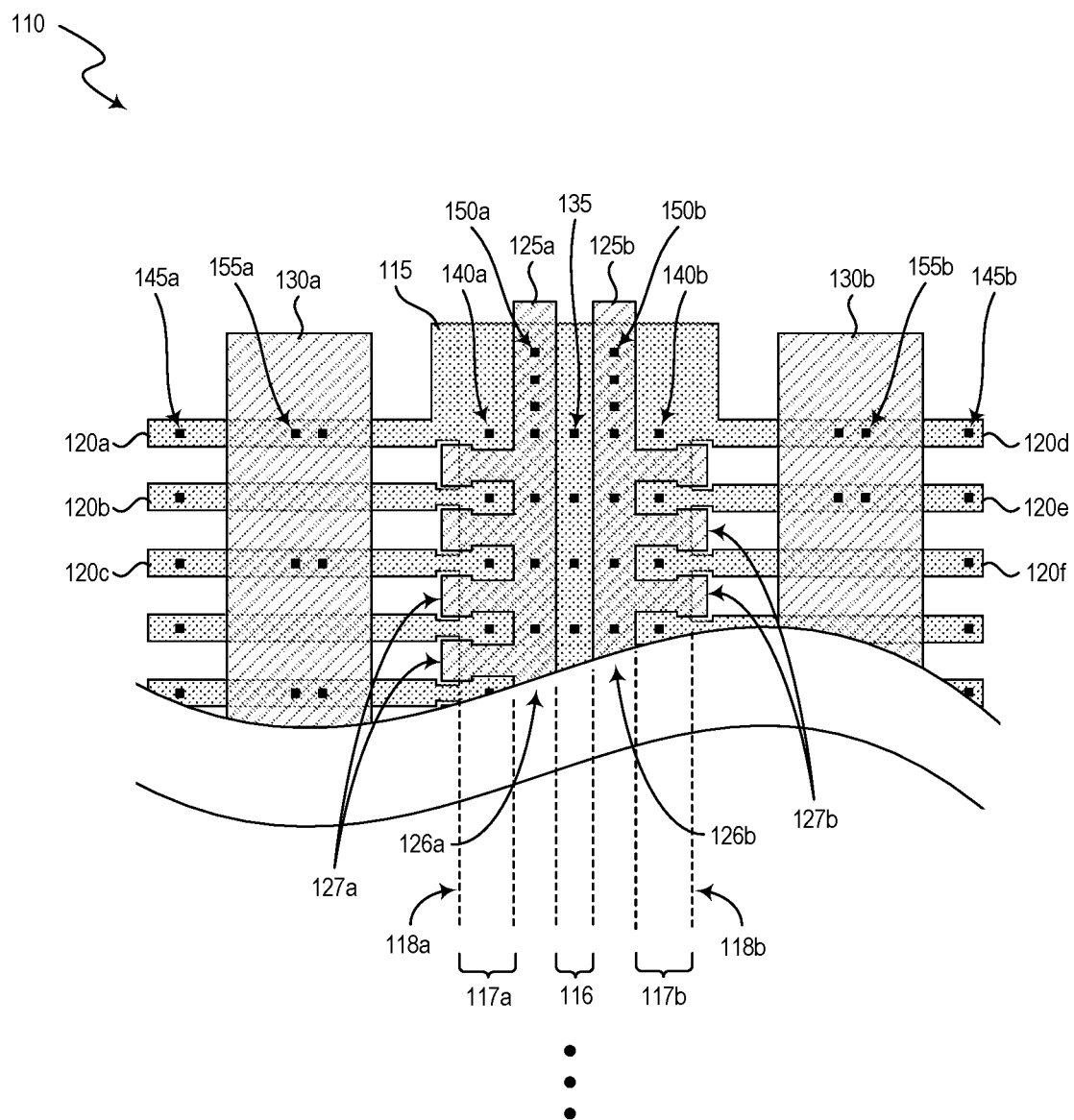
FIGS. 1A-1C are layouts of isolation devices in accordance with embodiments of the present technology.

Embodiments of the present technology include isolation devices for semiconductor devices—e.g., 3-dimensional (3D) NAND memory devices. The isolation devices, during certain operations of the memory devices (e.g., erase operations), may couple relatively high voltages (HVs) to memory cells of the memory devices while isolating other components (e.g., page buffers) of the memory devices from the high voltages. During other operations of the memory devices (e.g., read/write operations), the isolation devices may couple the memory cells to other components (e.g., page buffers) of the memory devices, which operate with relatively low voltages (LVs). Accordingly, such isolation devices may be referred to as LV-HV isolation devices or high voltage isolation devices.

In some embodiments, the isolation devices include narrow active areas configured to couple (or decouple) subsets of the memory cells to (or from) corresponding page buffers. To this end, the isolation devices include gates coupled with the narrow active areas to control conductivities of the narrow active areas through a gate dielectric material. Further, the isolation devices may be placed next to each other (e.g., side by side) such that a first group of narrow active areas of a first isolation device may be located adjacent to a second group of narrow active areas of a second isolation device. Accordingly, a first gate of the first isolation device disposed over the first group of narrow active areas can be located next to a second gate of the second isolation device disposed over the second group of narrow active areas.

As described in more detail herein, a length of the isolation device may be determined by configurations of memory arrays of the memory devices. For example, a quantity of the narrow active areas along the length of the isolation device corresponds to a quantity of bit lines of the memory array that the isolation device supports. A width of the isolation device, however, may be scaled independently of the memory array configuration such that an area occupied by the isolation devices can be reduced. For example, the first and second groups of narrow active areas may be interdigitated such that individual narrow active areas of the first group alternate with individual narrow active areas of the second group. Further, the first and second gates may be combined into one common gate over the interdigitated active areas such that the common gate can be shared by the first and second groups of the narrow active areas. The sharing of the common gate is feasible because the first and second gates are concurrently biased to a same voltage during the isolation device operations.

Additionally, or alternatively, widths of the first and second narrow active areas may be reduced (e.g., to a minimum feature size of the memory devices) to facilitate interdigitating the first and second narrow active areas. Further, widths of the first and second gates over the first and second narrow active areas may be reduced such that the first and second isolation devices can be brought closer to each other. In this manner, the area occupied by the isolation devices may be reduced to support ever-increasing quantity of memory cells built in a unit area of the memory devices and/or to reduce areas (e.g., footprints) occupied by the isolation devices.

Numerous specific details are disclosed herein to provide a thorough and enabling description of embodiments of the present technology. Moreover, the present technology may have additional embodiments, and may be practiced without several of the details of the embodiments described below with reference to FIGS. 1A through 2C. For example, some details of semiconductor devices well known in the art have been omitted so as not to obscure the present technology. In general, it should be understood that various other devices and systems in addition to those specific embodiments disclosed herein may be within the scope of the present technology.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques. A person skilled in the relevant art will also understand that the technology may have additional embodiments, and that the technology may be practiced without several of the details of the embodiments described below with reference to FIGS. 1A through 2C.

Figure 1B:
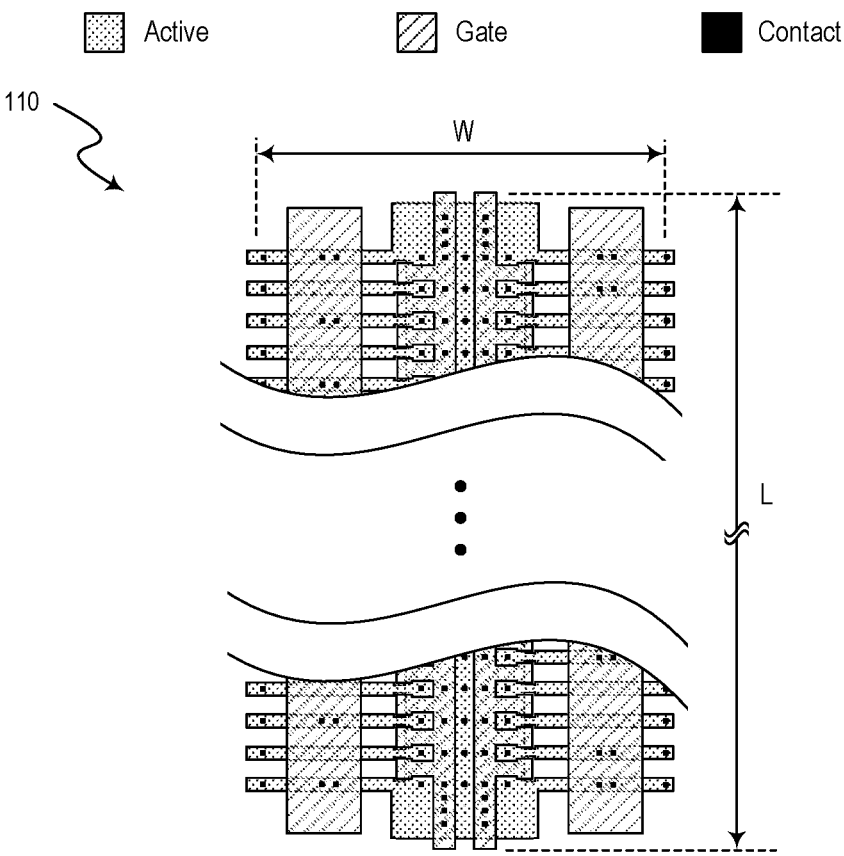
Figure 1C:
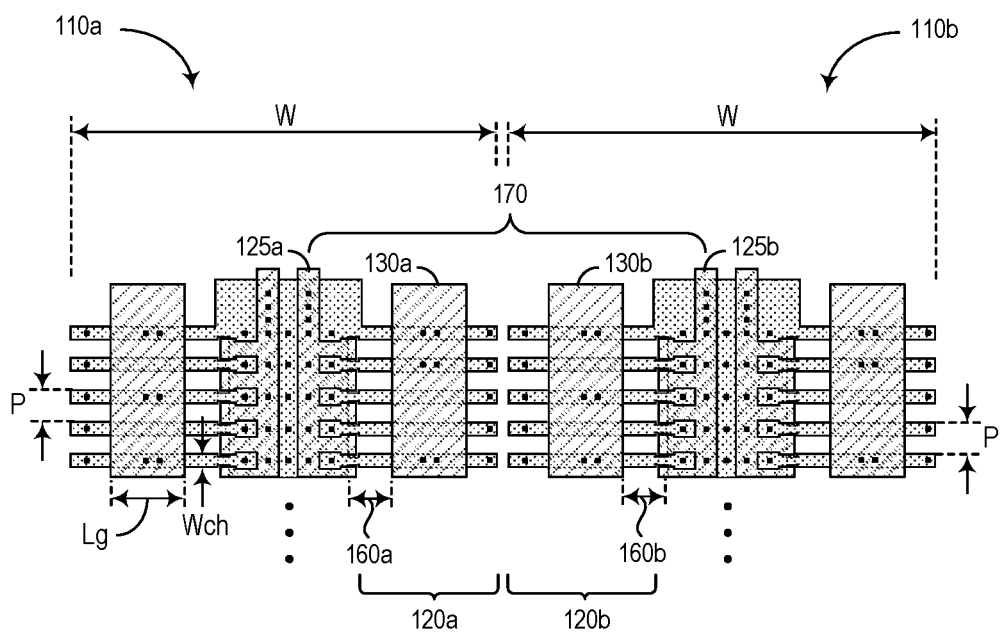
Figure 2A:
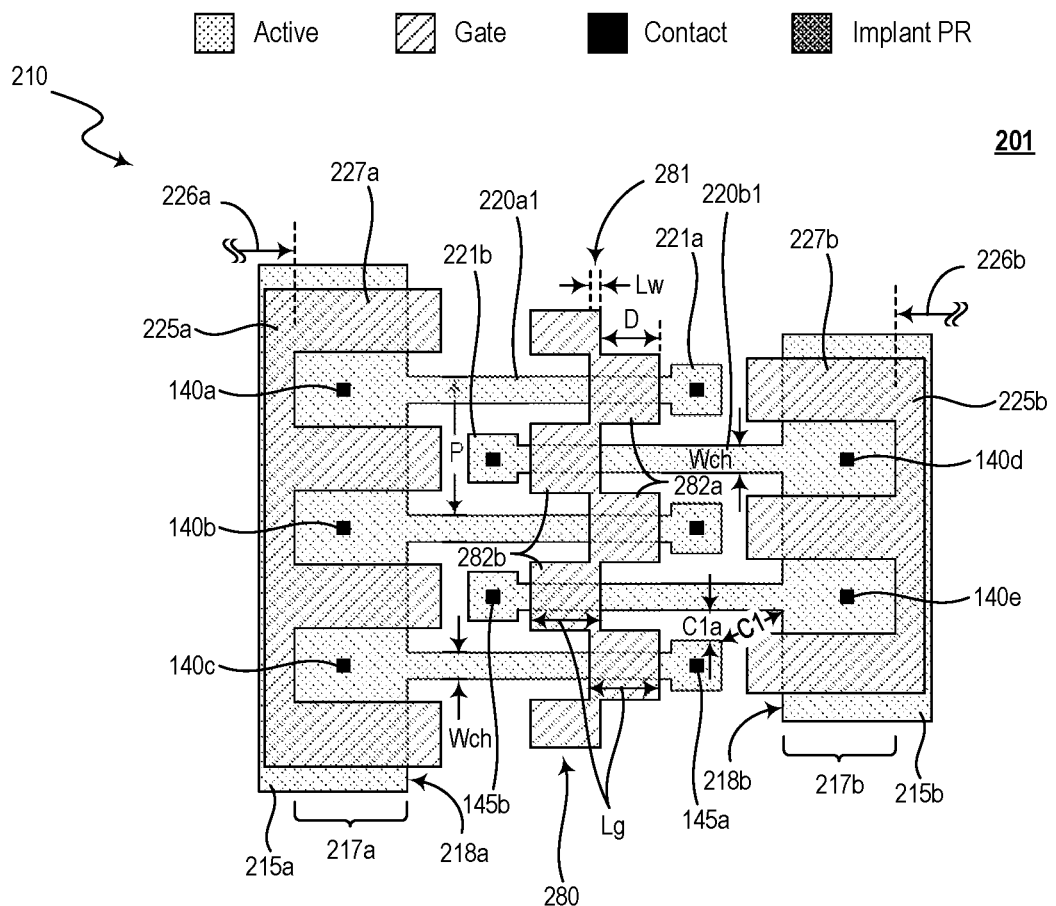
FIGS. 2A-2C are layout options for isolation devices in accordance with embodiments of the present technology.
Figure 2A:
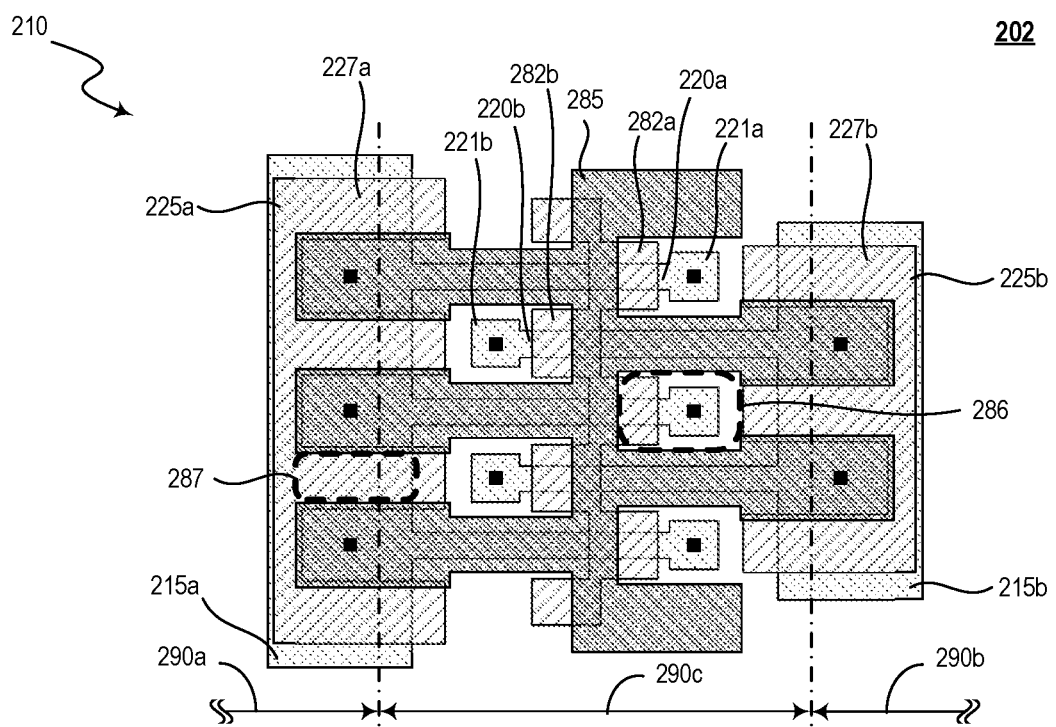
Figure 2B:
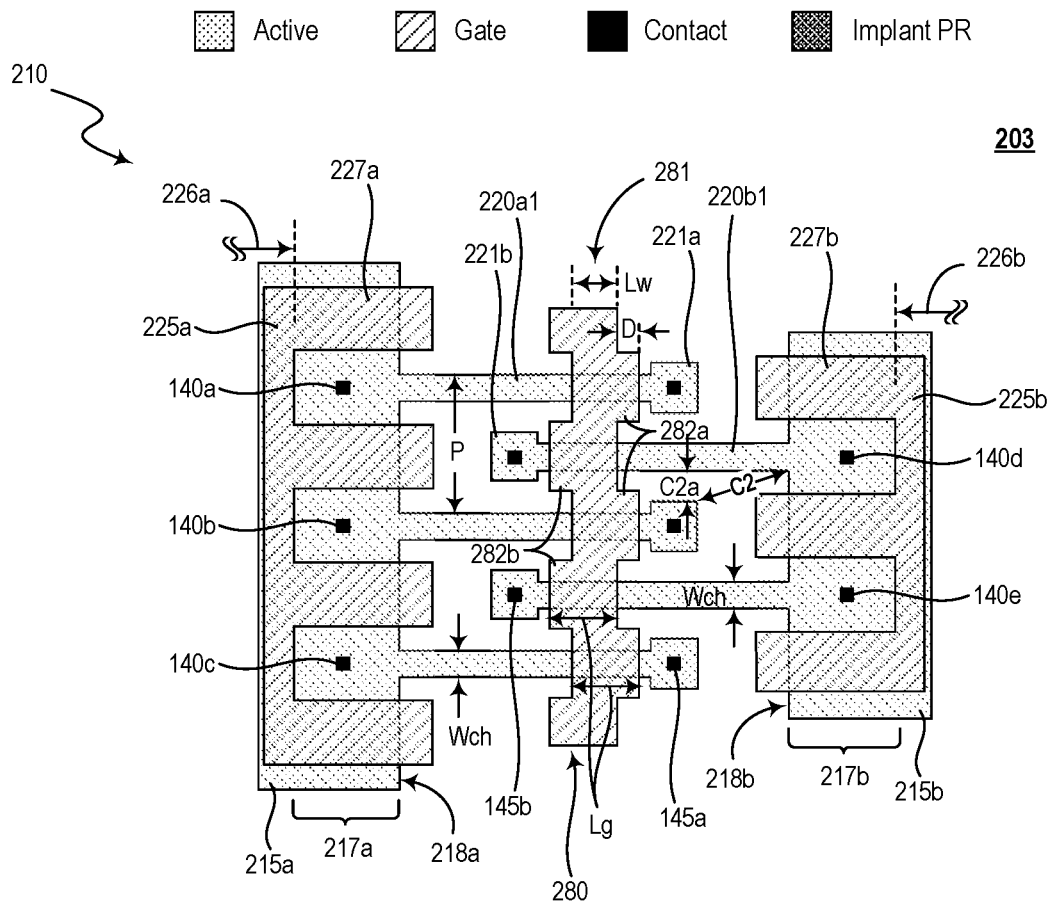
Figure 2B:
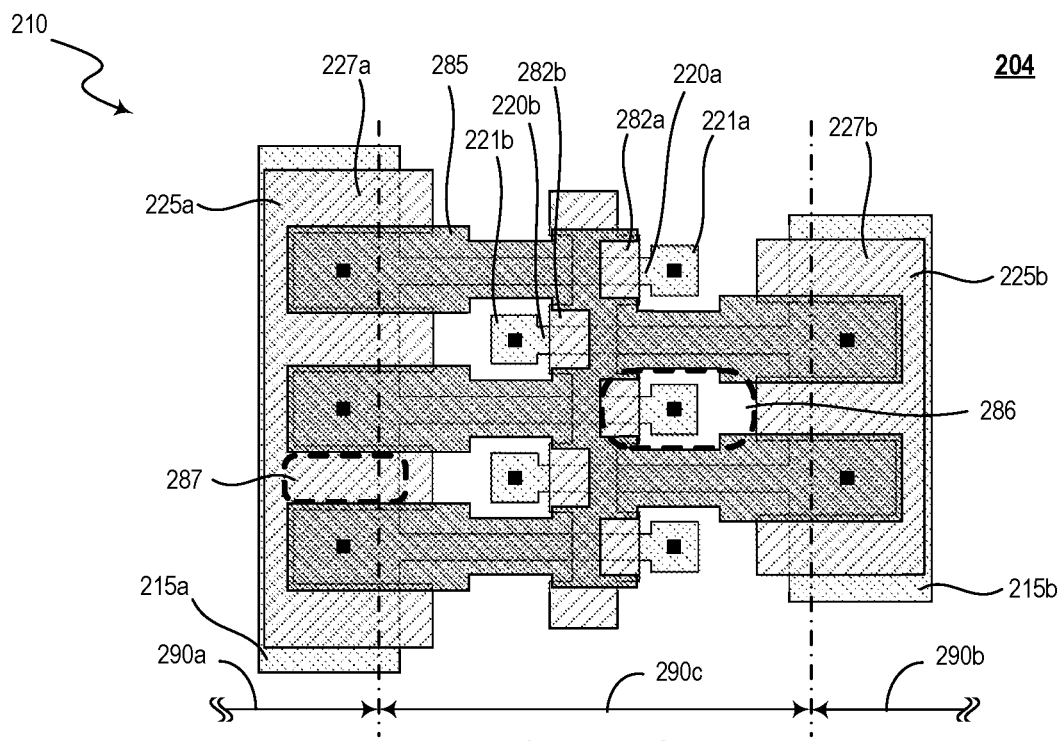
Figure 2C:
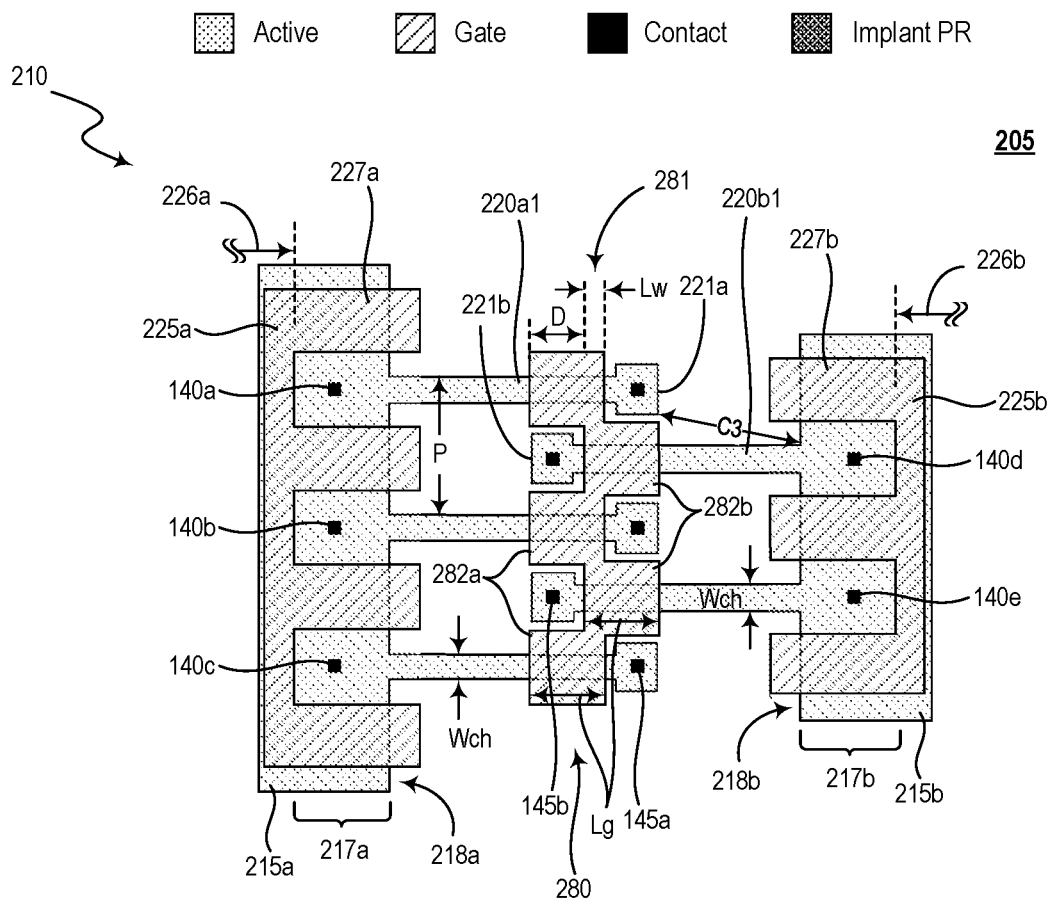
Figure 2C:
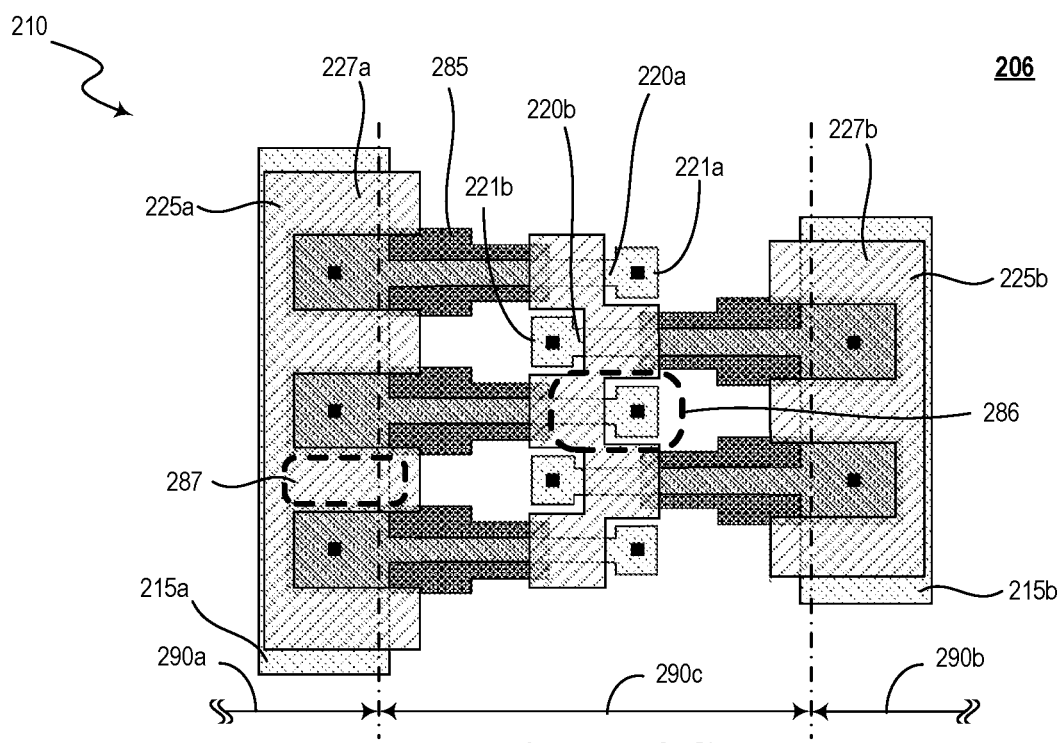

FIG. 1A describes various features of the high voltage isolation device in accordance with embodiments of the present technology. Moreover, operating principles of the isolation device are described with reference to FIG. 1A. FIGS. 1B and 1C illustrate aspects of the isolation device included in a semiconductor device to support operations of a memory array of the semiconductor device. FIGS. 2A through 2C illustrate layout options of the isolation device having interdigitated narrow active channels and a common gate over the active channels to reduce footprints of the isolation devices. The layout options illustrate various modifications directed to the interdigitated narrow active channels and the common gate. Further, trade-offs between the footprints of the isolation devices and risks associated with leakage currents during high voltage operations are described with reference to FIGS. 2A through 2C.

FIG. 1A is a layout of a portion of an isolation device 110 in accordance with embodiments of the present technology. In some embodiments, the isolation device 110 is part of a memory device (e.g., a 3D NAND memory device). Further, the isolation device 110 may be located under a memory array (e.g., an array of 3D NAND memory cells) to support operations of the memory device directed to the memory array—e.g., erase operations, read/write operations. The isolation device 110 includes active areas (e.g., an active area 115, active areas 120 (also identified individually as 120a-f)), gates (e.g., first gates 125 (also identified individually as 125a/b)), second gates 130 (also identified individually as 130a/b)), and contacts to the active areas and to the gates. The contacts to the active areas includes source contacts 135, bit line contacts 140 (also identified individually as 140a/b), and contacts 145 (also identified individually as 145a/b) at end portions of the active areas 120. The contacts to the gates includes contacts 150 (also identified individually as 150a/b) to the first gates 125 and contacts 155 (also identified individually as 155a/b) to the second gates 130. Additionally, the isolation device 110 includes other features (e.g., interconnects in dielectric layers, not shown) and may be coupled with other integrated circuitry and/or components of the memory device—e.g., a control circuit driving the isolation device 110, a memory array, page buffers, etc.

Active areas 115 and 120 correspond to areas of a substrate (e.g., a silicon substrate, in which the memory devices are fabricated) surrounded by dielectric materials providing electrical isolations among active areas of the substrate—e.g., dielectric materials in shallow trench isolation (STI) features in the substrate, which may be referred to as field regions. Further, the active areas 115 and 120 may include one or more dopant species that modify electrical and/or material characteristics of the active areas. As such, the active areas 115 and 120 may be referred to as diffusion areas and/or diffusion regions. For example, the active areas 115 and/or 120 may form source, channel, drain, and/or lightly-doped drain (LDD) regions of field-effect transistors (FETs) by selectively introducing one or more dopant species in various portions of the active areas. Further, active areas of the substrate may include other components of the memory device, such as diffusion resistors, wells, ground nodes, or the like.

The first and second gates 125 and 130 may include poly-crystalline silicon (poly-Si), metallic elements (e.g., tungsten (W), titanium (Ti), tantalum (Ta), etc.), silicides including the metallic elements (e.g., WSix), or a combination thereof. During operations of the isolation device 110, the first and second gates 125 and 130 may capacitively couple with the active areas underneath (e.g., channels of FETs) through a dielectric material to control (e.g., determine, modify) conductivities of the active areas. The dielectric material located between the active area and the first and second gates 125 and 130 may be referred to as gate dielectrics. The gate dielectrics may include silicon oxide, silicon nitride, oxides including high-k elements (e.g., hafnium (Hf), zirconium (Zr), lanthanum (La), etc.), silicates including the high-k elements (e.g., Hf-silicates, Zr-silicates), or a combination thereof.

The contacts 135 through 155 include conductive materials to couple various nodes of the isolation device 110 to other functional features or operational voltages of the memory device—e.g., a control circuit that operates the isolation device 110, a memory array, page buffers, etc. The contacts 135 through 155 may be filled with tungsten (W), and may be referred to as W0 contacts. The W0 contacts (and/or metallic traces connected thereto) may correspond to the lowest contacts and/or interconnects (e.g., formed earlier than other conductive features in the process flow fabricating interconnects of the memory device) that can be formed on the active areas 115 and 120, and the first and second gates 125 and 130.

In some embodiments, the active area 115 may be regarded to include a medial region 116 (e.g., central region) where a column of source contacts 135 are located. Further, the active area 115 includes outer regions 117 (also identified individually as 117a/b) (e.g., regions peripheral to the central region) where columns of bit line contacts 140 are located, respectively. Each individual bit line contacts 140 can be coupled to a corresponding bit line of the memory array.

The isolation device 110 also includes first gates 125 disposed over the active area 115. Individual first gates 125 may be regarded to have straight portions 126 (also identified individually as 126a/b) between the column of source contacts 135 and the columns of bit line contacts 140a/b, respectively. As such, the straight portions 126 of the first gates 125 may couple (or decouple) the source contacts 135 to (or from) the bit line contacts 140 based on a voltage applied to the first gates 125 through the contacts 150. Further, individual first gates 125 include sets of protruded segments 127 (also identified individually as 127a/b) that extend past the edges 118 (also identified individually as 118a/b) of the outer regions 117 in a first direction orthogonal to the column of bit line contacts 140. Individual protruded segments 127 of the first gates 125 are located between two neighboring bit line contacts 140 such that the protruded segments 127 can assist isolating the neighboring bit line contacts 140 from each other.

Further, the isolation device 110 includes a set of active channels 120 (e.g., narrow, elongated active areas that forms channels) connected to the edge 118 of the outer region 117. In this regard, a single contiguous active area may include both the active region 115 and the set of active channels 120. Each one of the active channels 120 is aligned with a corresponding bit line contact 140. Moreover, each individual active channel extends in the first direction (e.g., orthogonal to the column of bit line contacts 140) and includes an end portion away from the edge 118, where a contact 145 is located. Individual contacts 145 may be coupled to corresponding page buffers of the memory device. In this manner, page buffers can be coupled to (or decoupled from) corresponding bit line contacts 140 through individual contacts 145 (i.e., individual end portion of the active channels including the contact 145) during the operations of the memory array.

The isolation device 110 also includes a second gate 130 over the set of active channels 120, where the second gate 130 extends in a second direction orthogonal to the first direction—e.g., parallel to the column of bit line contacts 140. Moreover, the second gate 130 is located between the column of bit line contacts 140 and the contacts 145. As such, the second gate 130 may couple (or decouple) the bit line contacts 140 to (or from) the contacts 145 (thus, the page buffers coupled to the contacts 145) based on a voltage applied to the second gate 130 through the contacts 155.

During a first operation of the memory device under a relatively low voltage (LV)—e.g., LV operations, read/write operations, the first gate 125 may be turned off (e.g., grounded, deactivated) to decouple the source contacts 135 from the bit line contacts 140. Further, the second gate 130 may be turned on (e.g., activated) to couple the bit line contacts 140 to the contacts 145. In this manner, individual bit lines of the memory array coupled to the bit line contacts 140 can be coupled to corresponding page buffers either to read data from the memory cells of the bit lines to the page buffers or to write data from the page buffers to the memory cells of the bit lines. In some embodiments, the low voltage may vary between approximately 0.5V (e.g., 0.5V±5%, 0.5V±10%, or the like) to approximately 2.4V (e.g., 2.4V±5%, 2.4V±10%, or the like) to support various operations specified in the datasheets of the memory device. Under certain operating conditions (e.g., test operations), the low voltage may reach approximately 3.6V (e.g., 3.6V±5%, 3.6V±10%, or the like).

During a second operation of the memory device under a relatively high voltage (HV)—e.g., HV operations, erase operations, the high voltage (e.g., an erase voltage of approximately 15V to approximately 25V) may be applied to the source contacts 135. The first gate 125 may be turned on to couple the source voltage (i.e., the voltage of the medial region 116 where the source contacts 135 are located) to the bit line contacts 140 such that the erase voltage may be passed on to the memory array. Further, the second gate 130 may be turned off (e.g., grounded, deactivated) to decouple the bit line contacts 140 from the contacts 145 to isolate the high voltage from the contacts 145 (thus, from the page buffers coupled thereto). In some embodiments, the high voltage may vary between approximately 10V (e.g., 10V±5%, 10V±10%, or the like) to approximately 35V (e.g., 35V±5%, 35V±10%, or the like). As such, in some embodiments, a thickness of a gate dielectric material for the second gate 130 may be thick enough to sustain the high voltage across the gate dielectric material—e.g., the thickness ranging from approximately 35 nanometers (nm) to approximately 45 nm. In this manner, individual bit lines of the memory array can be coupled to the erase voltage while the page buffers are isolated from the erase voltage.

FIG. 1B is a layout of the isolation device 110 in accordance with embodiments of the present technology. The isolation device 110 is depicted to have a width W and a length L. Further, certain architectural aspects of the memory array may determine physical dimensions of the isolation device 110—e.g., the length L set by a length of a memory plane. For example, the length L of the isolation device 110 may be determined based on a quantity of bit lines of the memory array that the isolation device 110 supports. In this regard, a quantity of the narrow active areas 120 along the length of the isolation device 110 may correspond to a quantity of bit lines of the memory array. In some embodiments, the length L may vary between approximately 1,000 micrometers (μm) to approximately 10,000 μm. The width W of the isolation device 110, however, may be relatively independent of the memory array architecture. In some embodiments, the width W may vary between approximately 5 μm to approximately 8 μm. As such, the width W may be reduced as described in more detail with reference to FIGS. 1C and 2A-2C.

FIG. 1C is a layout illustrating a pair of isolation devices 110 (also identified individually as isolation devices 110a and 110b) in accordance with embodiments of the present technology. The isolation devices 110a and 110b are positioned side-by-side such that the active channels 120a and 120b are next to each other. Further, the isolation devices 110a and 110b may operate in pairs. For example, the second gates 130a and 130b may be biased together during operations of the isolation devices 110a and 110b. As such, the second gates 130a and 130b may be combined into one common gate as described with reference to FIGS. 2A-2C. Further, the active channels 120a and 120b may be interdigitated such that individual active channels 120a alternate with individual active channels 120b. In this manner, the isolation devices 110a and 110b can be brought closer to each other such that a total width corresponding to both isolation devices 110a and 110b (e.g., having the interdigitated active channels and the common gate shared by the interdigitated active channels) can be less than a sum of the widths of two individual isolation devices 110a and 110b (e.g., 2W).

In some embodiments, the thickness of the gate dielectric material for the second gates 130 can be reduced if, during the HV operations (e.g., erase operations), the high voltage (e.g., the erase voltage) coupled to the bit line contacts 140 is substantially distributed across LDD regions 160 of the active channels 120. In other words, while the second gate 130 is deactivated (e.g., grounded) during the HV operations, the electric field across the gate dielectric material may be reduced due to the voltage drop across the LDD regions such that the thickness of the gate dielectric material can be reduced. For example, the thickness of the gate dielectric material for the second gates 130 can be reduced to a thickness devised to support the relatively low voltage operations of the semiconductor device—e.g., the thickness ranging from approximately 3.5 nm to approximately 7.5 nm, which correspond to 1.8V to 3.3V operations, respectively. The LDD region 160 refers to part of the active channels 120 between the bit line contact 140 (or the edge 118 of the outer region 117) and an edge of the second gate 130 facing the bit line contact 140.

In this regard, the widths (denoted as Wch in FIG. 1C, which may vary between approximately 110 nm to approximately 150 nm in some embodiments) of the active channels 120 may be reduced (e.g., to a minimum feature size of the memory device) to increase resistance of the LDD region facilitating the voltage drop across the LDD region. For example, the widths of the active channels 120 may be reduced to approximately 100 nm (or less) corresponding to a minimum feature size for the active layer. Further, the reduced gate oxide thickness facilitates reducing the gate lengths (denoted as Lg in FIG. 1C, which may vary between approximately 200 nm to approximately 500 nm in some embodiments) of the second gate 130—e.g., without experiencing short channel effects. Moreover, the active channels 120b can be offset (e.g., shifted upward or downward) with respect to the active channel 120a such that the active channels 120a and 120b can be brought together to form interdigitated active channels. For example, the active channels 120b can be offset by one-half of the pitch (denoted as P in FIG. 1C, which may vary between approximately 400 nm to approximately 650 nm in some embodiments) of the active channels 120a and 120b. Additionally, a common gate (e.g., a combination of the second gates 130a and 130b) can be disposed above the interdigitated active channels such that the active channels 120a and 120b can share the common gate as described with reference to FIGS. 2A-2C.

FIG. 2A illustrates layouts 201 and 202 of a portion of an isolation device 210 in accordance with embodiments of the present technology. The isolation device 210 may be an example of or include aspects of the isolation device 110 described with reference to FIGS. 1A-1C. The layouts 201 and 202 may be regarded as the region 170 of the isolation devices 110a and 110b illustrated in FIG. 1C, which has been modified to form interdigitated active channels and a common gate shared by the interdigitated active channels such that an area occupied by the isolation devices 110a and 110b can be reduced. The layout 201 illustrates active, gate, and contact layers to describe various features of the isolation device 210 with the interdigitated active channels and the common gate. The layout 202 illustrates implant layers overlaid to the active, gate, and contact layers of the layout 201 to illustrate additional features of the isolation device 210.

The layout 201 illustrates active areas 215 (also identified individually as 215a/b) that include aspects of the active areas 115, such as medial regions (not shown), outer regions 217 (also identified individually as 217a/b), and edges 218 (also identified individually as 218a/b) of the outer regions 217. The medial regions of the active areas 215 includes one or more source contacts (e.g., the source contacts 135, not shown in the layout 201), and the outer regions 217 includes bit line contacts 140 (also identified individually as 140a-e). The bit line contacts 140 may be viewed to form columns of bit line contacts in the outer regions 217.

The layout 201 also illustrates a set of interdigitated active channels including a set of first active channels 220a (one of which is identified as 220a1) and a set of second active channels 220b (one of which is identified as 220b1). The sets of first and second active channels 220a/b are connected to edges 218 of the outer regions 217, respectively. Each one of the first and second active channels 220a/b is aligned with a corresponding bit line contact 140 and extends in a first direction orthogonal to the columns of bit line contacts 140. As shown in the layout 201, individual first active channels 220a alternate with individual second active channels 220b to form the set of interdigitated active channels between the outer regions 217a/b. In this regard, the set of second active channels 220b may have been offset by a distance (e.g., shifted up or down by the distance in a direction orthogonal to the active channels 220) with respect to the set of first active channels 220a, or vice versa. In some embodiments, the distance corresponds to one-half of a pitch (denoted as P in FIG. 2A, which may vary between approximately 400 nm to approximately 650 nm in some embodiments) of the first active channels 220a (or the second active channels 220b).

Further, the first and second active channels 220a/b may have a width (denoted as Wch in FIG. 2A, which may vary between approximately 110 nm to approximately 150 nm in some embodiments) orthogonal to the first direction. In some embodiments, the width corresponds to a minimum feature size of the semiconductor device, which may be based on a process technology node to fabricate the semiconductor device. For example, the width may be approximately 100 nm (or less). As described above, the active channels 220 with the minimum width may facilitate distributing a high voltage (e.g., the erase voltage) coupled to the bit line contacts 140 across the LDD region of the active channels 220 such that a thickness of the gate dielectric material above the active channels 220a/b can be reduced—e.g., to a thickness supporting relatively low voltage operations of the semiconductor device.

The first and second active channels 220a/b includes end portions 221a/b where contacts 145a/b are located. The contacts 145a/b may be coupled to page buffers of the memory device. The end portions 221a/b are away from corresponding edges 218a/b of the outer regions 217a/b, and may have different (e.g., greater) dimensions than the width (Wch) of the active channels. For example, the end portions 221a/b includes active area endcaps surrounding the contacts 145a/b such that the contacts 145a/b are within the endcaps of the end portions 221a/b independent of statistical process variations (e.g., variations in critical dimensions (CDs) of the contacts 145a/b and/or the end portions 221a/b, fluctuations in registrations between the active layer and the contact layer).

The layout 201 illustrates a common gate 280 over the set of interdigitated active channels. The common gate 280 extends in a second direction parallel to the columns of bit line contacts 140 and couples with the set of interdigitated active channels through the gate dielectric material disposed between the common gate 280 and the interdigitated active channels. That is, the common gate 280 is shared by the first and second active channels 220a/b—e.g., two separate gates 130a/b depicted in FIG. 1C are combined into the common gate 280. The common gate 280 is located between two end portions 221a and 221b of the opposing active channels 220a and 220b, within which the contacts 145a/b are located.

Further, the common gate 280 includes a straight portion 281 having a width (denoted as Lw in FIG. 2A, which may vary between approximately 60 nm to approximately 200 nm in some embodiments), a set of first segments 282a extending from a first edge of the straight portion 281 by a distance (denoted as D in FIG. 2A, which may vary between approximately 200 nm to approximately 400 nm in some embodiments) parallel to the first direction, and a set of second segments 282b extending from a second edge of the straight portion 281 by the distance (D) parallel to the first direction, where the second edge is opposite from the first edge of the straight portion 281. Individual first and second segments 282a/b are located above corresponding first and second active channels 220a/b. A sum of the width Lw and the distance D may determine electrical channel lengths (denoted as Lg) of the first and second active channels 220a/b. As shown in the layout 201, individual first segments 282a extend away from the edge 218a of the outer region 217a of the active area 215a (or extend toward the edge 218b of the outer region 217b of the active area 215b). Similarly, individual second segments 282b extend away from the edge 218b of the outer region 217b of the active area 215b (or extend toward the edge 218a of the outer region 217a of the active area 215a). As such, the common gate 280 may be regarded as a contiguous gate feature with "zig-zag" patterns or "zipper" patterns. In some embodiments, the width Lw of the straight portion 281 corresponds to a minimum feature size of the memory device. The width Lw at the minimum feature size (or greater) would provide reliable bridging between individual first and second segments 282a/b.

The layout 201 illustrates gates 225 (also identified individually as 225a/b) over the active areas 215. The gates 225 includes aspects of the gates 125 described with reference to FIG. 1A. For example, the gate 225a is located between the one or more source contacts located in the medial region (not shown) of the active area 215a and the bit line contacts 140 (e.g., the bit line contacts 140a-c) located in the outer region 217a. Further, the gates 225 include sets of protruded segments 227 (also identified individually as 227a/b) extending in the first direction past respective edges 218 of the outer regions 217. Individual protruded segments 227a/b are located between two neighboring bit line contacts 140 of the respective outer regions—e.g., bit line contacts 140a and 140b are separated by one of the protruded segments 227a, bit line contacts 140d and 140e are separated by one of the protruded segments 227b. In this manner, the protruded segments 227a/b can assist electrically isolating individual bit line contacts 140 from the neighboring bit line contacts 140 within respective outer regions 217 of the active area 215.

The layout 202 illustrates a first implant layer 285 laid over the layout 201. The shaded regions of the first implant layer 285 correspond to a photoresist material configured to block one or more dopant species of the first implant process steps. In some embodiments, the dopant species for the first implant steps may include boron, indium, or other suitable p-type dopants—e.g., dopants exhibiting positive polarity when ionized. In other embodiments, the dopant species for the first implant steps may include phosphorus, arsenic or other suitable n-type dopants—e.g., dopants exhibiting negative polarity when ionized. Further, the first implant steps may be carried out with implant energies large enough to penetrate the gates (e.g., the first gates 225, the common gate 280), if performed after forming the gates, but not the photoresist material. As such, the regions of the layout 202 uncovered by the well implant layer 285 would receive the dopant species during the first implant process steps. Such uncovered regions includes the field regions (white spaces of the layout 202 corresponding to the STI isolation regions), the regions around and including the end portions 221a/b (also including portions of the segments 282a/b of the common gate 280 and portions of the interdigitated active channels under the segment 282a/b proximate to the end portions 221a/b, one of such regions identified with box 286), and the gates 225 including the protruded segments 227 and portions of the active areas 215 uncovered by the resist material (e.g., under the protruded segments 227 of the gates 225, one of such portions of the active area 215 identified with box 287).

The dopant species for the first implant steps may be determined to increase threshold voltages of the active area including the dopant species. For example, the first implants into the portions of the interdigitated active channels proximate to the end portions 221a/b (and under the segments 282a/b of the common gate 280) increases the threshold voltage for the common gate 280 (e.g., increase the local threshold voltage of the portions implanted), which in turn helps to avoid short channel effects for the common gate 280. Similarly, the first implants into the portions of the active areas 215 under the protruded segments 227 of the gates 225 (e.g., the active area identified with the box 287) increase the threshold voltage for the protruded segments 227 of the gates 225, which in turn helps to electrically isolate the bit line contacts (e.g., bit line contact 140b) from neighboring bit line contacts (e.g., bit line contacts 140a and/or 140c). In some embodiments, the first implant steps are carried out with p-type dopant species (e.g., boron, indium).

Further, the layout 202 illustrates a second implant layer 290. Regions 290a and 290b correspond to areas without a photoresist material during the second implant process steps while most of the region 290c is covered by the photoresist material except openings around and including the end portions 221a/b—e.g., one of such openings corresponding to the box 286. Dopant species of the second implant steps includes species having an opposite polarity to the dopant species used for the first implant steps. The second implant steps may reduce contact resistances between the active regions open to the second implant steps and the contacts formed therein. For example, the dopant species for the second implant steps may include arsenic and/or phosphorus atoms (e.g., n-type dopants) if the first implant steps were carried out with boron and/or indium atoms (e.g., p-type dopants).

The layout 201 may be regarded as an aggressively compact layout with a relatively high risk of leakage current when compared to the layouts 203 and/or 205 illustrated in FIGS. 2B and 2C. For example, an area occupied by the layout 201 may be less than the areas occupied by the layouts 203 and/or 205. However, the risk associated with leakage current issues during HV operations may be greater for the layout 201 when compared to the layouts 203 and 205. In this regard, the layout 201 illustrates two critical distances (denoted as C1 and C1a) for the leakage current. In some embodiments, C1a may vary between approximately 100 nm to approximately 400 nm, and C1 may vary between approximately 200 nm to approximately 500 nm.

During the HV operations, the bit line contacts (e.g., the bit line contact 140e) are coupled to the high voltage (e.g., the erase voltage for the memory array) while the contacts (e.g., the contact 145a) in the end portions 221a of the opposing active channels 220a are held at a low voltage (e.g., grounded). As such, the shorter the critical distance C1 is, the higher the risks associated with the leakage current between the high voltage node (e.g., the bit line contacts 140 or the active areas including the bit line contacts 140) and the low voltage nodes (e.g., the contacts 145 or the end portions 221 of the opposing active channels).

Further, as the low voltage nodes are the distance C1a away from the LDD regions of the opposing active channels connected to the high voltage node, the leakage current may arise therebetween. In addition, the distance C1a may be less than the critical distance C1. As the high voltage of the bit line contacts 140 drops across the LDD regions, however, the leakage current between the LDD regions and the end portions of the opposing active channels may be less severe (although non-zero, in some cases) than the leakage current between the bit line contacts 140 and the nearest contacts 145.

FIG. 2B illustrates layouts 203 and 204 of a portion of an isolation device 210 in accordance with embodiments of the present technology. The layouts 203 and 204 include various aspects of the layouts 201 and 202 described with reference to FIG. 2A. As such, descriptions directed to common aspects between the layouts 201/202 and 203/204 are omitted for the layouts 203/204 to avoid duplicating the same descriptions. Several aspects of the layouts 203 and 204 different than the layouts 201 and 202 include an overall shape of the common gate 280, a distance between the edges 218a/b of the active areas 225a/b, the critical distance between the high voltage nodes and the low voltage nodes (denoted as C2 in the layout 203), an overall shape of the first implant layer 285, among others. For example, the distance between the edges 218a and 218b of the layout 203 is greater than that of the layout 201. Accordingly, the critical distance C2 of the layout 203 is greater than the critical distance C1 of the layout 201. In some embodiments, C2 may vary between approximately 400 nm to approximately 600 nm, and C2a may vary between approximately 100 nm to approximately 400 nm.

The common gate 280 of the layout 203 includes a straight portion 281 having a width (denoted as Lw in FIG. 2B, which may vary between approximately 200 nm to approximately 400 nm in some embodiments), a set of first segments 282a extended from a first edge of the straight portion 281 by a distance (denoted as D in FIG. 2B, which may vary between approximately 50 nm to approximately 250 nm in some embodiments) parallel to the first direction, and a set of second segments 282b extending from a second edge of the straight portion 281 by the distance (D) parallel to the first direction, where the second edge is opposite from the first edge of the straight portion 281. The width Lw of the layout 203 may be greater than that of the layout 201. For example, the width Lw of the layout 203 may be greater than the minimum feature size of the memory device. Further, the distance D of the layout 203 may be less than that of the layout 201. A sum of the width Lw and the distance D of the layout 203 may be maintained the same as that of the layout 201.

The layout 203 may be regarded as a mildly compact layout with a medium risk of leakage current when compared to the layouts 201 and/or 205 illustrated in FIGS. 2A and 2C. For example, an area occupied by the layout 203 may be greater than the area occupied by the layout 201, but less than the area occupied by the layout 205. Further, the risk associated with the leakage current during the HV operations may be greater for the layout 203 when compared to the layout 205, but less when compared to the layout 201. For example, the critical distance C2 is greater than the critical distance C1 such that the leakage current between the high voltage node (e.g., the bit line contacts 140 or the active areas including the bit line contacts 140) and the low voltage nodes (e.g., the contacts 145 or the end portions 221 of the opposing active channels) is expected to be reduced for the layout 203 when compared to the layout 201. Moreover, although the distance C2a may be approximately equal to the distance C1a, the leakage current between the LDD regions and the low voltage node may be reduced for the layout 203 when compared to the layout 201 because the high voltage of the bit line contacts 140 drops more across the LDD regions due to the greater distance between the low voltage nodes and the high voltage nodes.

FIG. 2C illustrates layouts 205 and 206 of a portion of an isolation device 210 in accordance with embodiments of the present technology. The layouts 205 and 206 include various aspects of the layouts 201 and 202 described with reference to FIG. 2A. As such, descriptions directed to common aspects between the layouts 201/202 and 205/206 are omitted for the layouts 205/206 to avoid duplicating the same descriptions. Several aspects of the layouts 205 and 206 different than the layouts 201 and 202 include an overall shape of the common gate 280, a distance between the edges 218a/b of the active areas 225a/b, the critical distance (denoted as C3 in the layout 205 of FIG. 2C, which may vary between approximately 450 nm to approximately 850 nm in some embodiments), an overall shape of the first implant layer 285, among others. For example, the distance between the edges 218a and 218b of the layout 205 is greater than that of the layout 201 or the layout 203. Accordingly, the critical distance C3 of the layout 205 is greater than the critical distance C1 of the layout 201 or the critical distance C2 of the layout 203.

The common gate 280 of the layout 205 includes a straight portion 281 having a width (denoted as Lw in FIG. 2C, which may vary between approximately 60 nm to approximately 400 nm in some embodiments), a set of first segments 282a extended from a first edge of the straight portion 281 by a distance (denoted as D in FIG. 2C, which may vary between approximately 60 nm to approximately 400 nm in some embodiments) parallel to the first direction, and a set of second segments 282b extending from a second edge of the straight portion 281 by the distance (D) parallel to the first direction, where the second edge is opposite from the first edge of the straight portion 281. Individual first segments 282a extend toward the edge 218a of the outer region 217a of the active area 215a, and individual second segments 282b extend toward the edge 218b of the outer region 217b of the active area 215b. As such, the common gate 280 of the layout 205 may be regarded as a contiguous gate feature with "zig-zag" patterns similar to the common gates of the layouts 201 and 203, but with an opposite direction of the "zig-zag" patterns. In some embodiments, the width Lw of the layout 205 may be greater than that of the layout 201. In other embodiments, the width Lw of the layout 205 may correspond to the minimum feature size of the memory device. A sum of the width Lw and the distance D of the layout 205 may be maintained the same as that of the layout 201.

The layout 205 may be regarded as a conservatively compact layout with a relatively low risk of leakage current when compared to the layouts 201 and/or 203 illustrated in FIGS. 2A and 2B. For example, an area occupied by the layout 205 may be greater than the area occupied by the layout 201 or the layout 203. However, the risk associated with the leakage current during the HV operations may be less for the layout 205 when compared to the layout 201 or the layout 203. For example, the critical distance C3 is greater than the critical distance C2 (or C1) such that the leakage current between the high voltage node (e.g., the bit line contacts 140 or the active areas including the bit line contacts 140) and the low voltage nodes (e.g., the contacts 145 or the end portions 221 of the opposing active channels) is expected to be reduced for the layout 205 when compared to the layout 203 (or the layout 201).

Further, the layout 205 depicts that the contacts that are grounded during the HV operations (e.g., the contacts 145) are located between two neighboring segments 282 of the common gate 280. In view of the straight portion 281 of the common gate 280 proximate to the end portions 221, the low voltage nodes (e.g., the grounded contacts 145, the end portions 221 including the grounded contacts 145) are surrounded on three sides such that the low voltage nodes can be better isolated from the LDD regions of the neighboring active channels when compared to the layouts 201 and/or 203. As such, the layout 205 may be least likely to have the leakage current issues among the layouts 201, 203, and 205.

Figure 3:
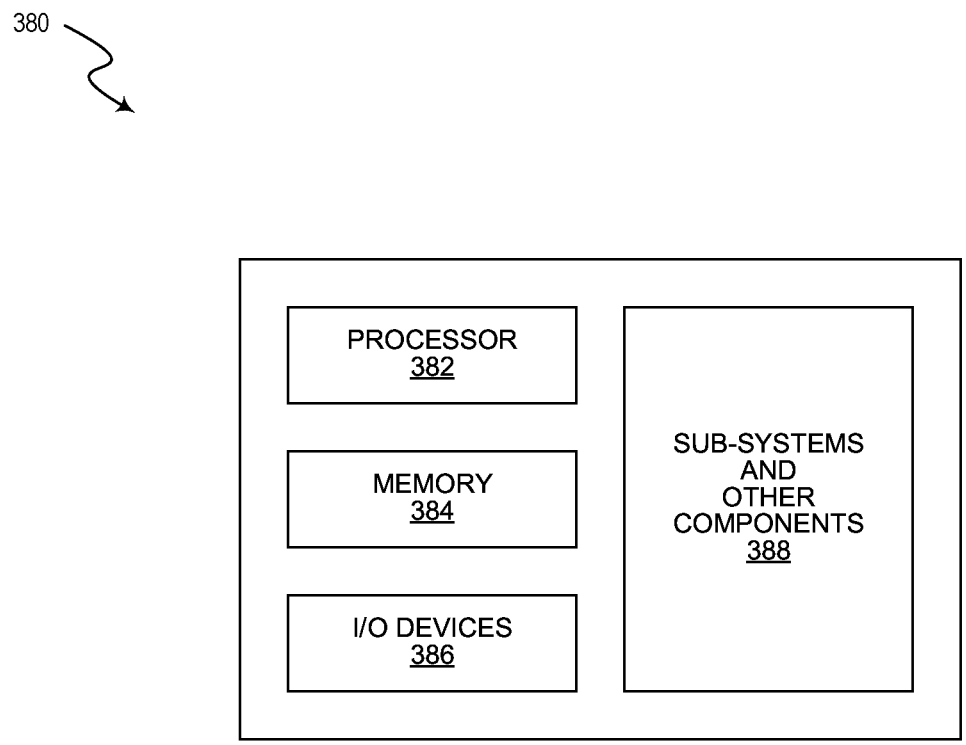
FIG. 3 is a schematic view of a system that includes a memory device including isolation devices in accordance with embodiments of the present technology.

The memory devices described in detail above with reference to FIGS. 1A through 2C or packages incorporating such a memory device can be incorporated into any of a myriad of larger and/or more complex systems, a representative example of which is a system 380 shown schematically in FIG. 3. The system 380 can include a processor 382, a memory 384 (e.g., SRAM, DRAM, flash, 3D NAND, 3D cross-point and/or other memory devices), input/output devices 386, and/or other subsystems or components 388. For example, the memory 384 may include the isolation devices described with reference to FIG. 1A through 2C (e.g., the isolation device 110, the isolation device 210 with various modifications). As such, the memory devices of the memory 384 can include high voltage isolation devices with interdigitated active channels sharing a common gate. In some embodiments, the common gate is a contiguous feature including a "zig-zag" pattern. The memory devices and/or packages incorporating such memory devices can be included in any of the elements shown in FIG. 3.

The resulting system 380 can be configured to perform any of a wide variety of suitable computing, processing, storage, sensing, imaging, and/or other functions. Accordingly, representative examples of the system 380 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 380 include lights, cameras, vehicles, etc. With regard to these and other example, the system 380 can be housed in a single unit or distributed over multiple interconnected units, for example, through a communication network. The components of the system 380 can accordingly include local and/or remote memory storage devices and any of a wide variety of suitable computer-readable media.

It should be noted that embodiments illustrated above describe possible implementations, and that the various schemes of integrating process steps and their sequence for the embodiments may be rearranged or otherwise modified and that other implementations are possible. Furthermore, embodiments from two or more of the modifications may be combined. From the foregoing, it will be appreciated that specific embodiments of the technology have been described herein for purposes of illustration, but that various modifications may be made without deviating from the disclosure. In addition, while in the illustrated embodiments certain features or components have been shown as having certain arrangements or configurations, other arrangements and configurations are possible. Moreover, certain aspects of the present technology described in the context of particular embodiments may also be combined or eliminated in other embodiments.

Although in foregoing example embodiments, isolation devices of semiconductor devices including 3D NAND flash memory have been described and illustrated, in other embodiments, semiconductor devices may be provided with different types of memory arrays—e.g., 3D cross-point memory, DRAM, resistive memory, magnetic memory, ferroelectric memory, etc. Moreover, the present technology of modifying shapes (design, layout) of various components (e.g., gates, active areas, implant layers) of the isolation device (or other integrated circuitry) may be applied to semiconductor devices other than memory devices to reduce areas occupied by the isolation devices while mitigating risks associated with leakage currents stemming from compact and dense layouts.

The devices discussed herein, including a semiconductor device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, indium, or arsenic. Doping may be performed during the initial formation or growth of the substrate, by ion-implantation, or by any other doping means.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor device, comprising:
   an active area including a medial region having one or more source contacts and an outer region having a single column of bit line contacts;
   a plurality of interdigitated active channels including 1) a plurality of first active channels connected to an edge of the outer region, wherein each one of the first active channels is aligned with a corresponding bit line contact and extends in a first direction orthogonal to the single column of bit line contacts, and 2) a plurality of second active channels spaced away from the edge of the outer region, wherein the second active channels are parallel to the first active channels such that individual first active channels alternate with individual second active channels; and a common gate over the plurality of interdigitated active channels, the common gate extending in a second direction parallel to the single column of bit line contacts and configured to couple with the plurality of interdigitated active channels.

2. The semiconductor device of claim 1, wherein the plurality of second active channels is offset by a distance in the second direction with respect to the plurality of first active channels, the distance corresponding to one-half of a pitch of the first active channels.

3. The semiconductor device of claim 1, wherein the first and second active channels have a width orthogonal to the first direction, the width corresponding to a minimum feature size of the semiconductor device.

4. The semiconductor device of claim 1, further comprising:
a gate dielectric material between the common gate and the plurality of interdigitated active channels, a thickness of the gate dielectric material supporting relatively low voltage operations of the semiconductor device.

5. The semiconductor device of claim 1, further comprising:
a plurality of first contacts that each is located in first end portions of the first active channels, the first end portions opposite to the corresponding bit line contacts; and
a plurality of second contacts that each is located in second end portions of the second active channels, the second end portions proximate to the edge of the outer region.

6. The semiconductor device of claim 5, wherein:
individual first contacts are connected to corresponding first page buffers of the semiconductor device; and
individual second contacts are connected to corresponding second page buffers of the semiconductor device.

7. The semiconductor device of claim 5, wherein the common gate is located between the plurality of first contacts and the plurality of second contacts.

8. The semiconductor device of claim 5, wherein the common gate comprises:
a straight portion having a width orthogonal to the second direction;
a plurality of first segments extending from a first edge of the straight portion by a distance parallel to the first direction, wherein individual first segments are located above corresponding first active channels; and
a plurality of second segments extending from a second edge of the straight portion by the distance parallel to the first direction, the second edge opposite from the first edge, wherein individual second segments are located above corresponding second active channels.

9. The semiconductor device of claim 8, wherein the distance and the width, in combination, determine electrical channel lengths of the first and second active channels.

10. The semiconductor device of claim 8, wherein:
individual first segments extend away from the edge of the outer region of the active area; and
individual second segments extend toward the edge of the outer region of the active area.

11. The semiconductor device of claim 8, wherein:
individual first segments extend toward the edge of the outer region of the active area; and
individual second segments extend away from the edge of the outer region of the active area.

12. The semiconductor device of claim 8, wherein:
one or more first contacts are located between two neighboring second segments of the common gate; and
one or more second contacts are located between two neighboring first segments of the common gate.

13. The semiconductor device of claim 8, wherein portions of the interdigitated active channels under the common gate include dopant atoms that increase a threshold voltage of the portions of the interdigitated active channels.

14. The semiconductor device of claim 1, further comprising:
a gate over the active area and located between the one or more source contacts and the single column of bit line contacts, the gate extending in the second direction.

15. The semiconductor device of claim 14, wherein the gate comprises a plurality of protruded segments extending in the first direction past the edge of the outer region, individual protruded segments located between two neighboring bit line contacts.

16. The semiconductor device of claim 15, wherein portions of the outer region of the active area under the protruded segments of the gate includes dopant atoms that increase a threshold voltage of the portions of the outer region.

17. A semiconductor device, comprising:
an active area including a medial region having a column of source contacts and an outer region having a column of bit line contacts;
a first gate over the active area, the first gate including 1) a straight portion located between the columns of source contacts and bit line contacts and 2) a plurality of protruded segments connected to the straight portion, wherein individual protruded segments extend past an edge of the outer region in a first direction orthogonal to the column of bit line contacts and are located between two neighboring bit line contacts;
a plurality of first active channels connected to the edge of the outer region, wherein each one of the first active channels is aligned with a corresponding bit line contact and extends in the first direction; and
a second gate over the plurality of first active channels, the second gate extending in a second direction parallel to the column of bit line contacts.

18. The semiconductor device of claim 17, further comprising:
a plurality of second active channels spaced away from the edge of the outer region, each one of the second active channels extending in the first direction, wherein:
the plurality of first active channels and the plurality of second active channels form a plurality of interdigitated active channels such that individual first active channels alternate with individual second active channels; and
the second gate is over the plurality of interdigitated active channels and configured to couple with the plurality of interdigitated active channels.

19. A semiconductor device, comprising:
a first active area including a first medial region and a first outer region with a single column of first bit line contacts;
a plurality of first active channels connected to an edge of the first outer region, wherein each one of the first active channels is aligned with a corresponding first bit line contact and extends in a first direction orthogonal to the single column of first bit line contacts;

a second active area including a second medial region and a second outer region with a single column of second bit line contacts;

a plurality of second active channels connected to an edge of the second outer region, wherein each one of the second active channels is aligned with a corresponding second bit line contact and extends in the first direction, and wherein:

the first outer region faces the second outer region; and the plurality of first active channels and the plurality of second active channels form a plurality of interdigitated active channels such that individual first active channels alternate with individual second active channels; and a common gate over the plurality of interdigitated active channels, the common gate extending in a second direction parallel to the single column of first bit line contacts and configured to couple with the plurality of interdigitated active channels.

20. The semiconductor device of claim 19, wherein the first and second active channels have a width orthogonal to the first direction, the width corresponding to a minimum feature size of the semiconductor device.

* * * * *